(12) United States Patent
Thomas

(10) Patent No.: US 7,763,975 B2
(45) Date of Patent: Jul. 27, 2010

(54) FLIP-CHIP ASSEMBLY OF PROTECTED MICROMECHANICAL DEVICES

(75) Inventor: Sunil Thomas, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 130 days.

(21) Appl. No.: 11/963,585

(22) Filed: Dec. 21, 2007

(65) Prior Publication Data

US 2008/0093689 A1    Apr. 24, 2008

Related U.S. Application Data

(60) Continuation of application No. 10/695,026, filed on Oct. 28, 2003, now abandoned, and a continuation-in-part of application No. 10/283,494, filed on Oct. 30, 2002, now Pat. No. 6,656,768, and a division of application No. 09/779,001, filed on Feb. 8, 2001, now Pat. No. 6,507,082.

(60) Provisional application No. 60/184,091, filed on Feb. 22, 2000.

(51) Int. Cl.
*H01L 23/48* (2006.01)

(52) U.S. Cl. .................. 257/724; 257/693; 257/723; 257/E23.021

(58) Field of Classification Search .................. 257/432, 257/693, E23.021, 723, 724
See application file for complete search history.

(56) References Cited

U.S. PATENT DOCUMENTS

| | | | |
|---|---|---|---|
| 5,293,511 A | | 3/1994 | Poradish et al. |
| 5,500,540 A | * | 3/1996 | Jewell et al. .................. 257/82 |
| 5,610,431 A | | 3/1997 | Martin |
| 5,936,758 A | | 8/1999 | Fisher et al. |
| 6,084,777 A | * | 7/2000 | Kalidas et al. .............. 361/707 |
| 6,208,023 B1 | * | 3/2001 | Nakayama et al. .......... 257/696 |
| 6,310,120 B1 | | 10/2001 | Shiobara et al. |
| 6,507,082 B2 | | 1/2003 | Thomas |
| 6,534,340 B1 | | 3/2003 | Karpman et al. |
| 6,656,768 B2 | | 12/2003 | Thomas |
| 2003/0020094 A1 | * | 1/2003 | Shrauger .................... 257/200 |
| 2003/0142913 A1 | * | 7/2003 | Li ............................... 385/47 |

FOREIGN PATENT DOCUMENTS

EP         0675 536        4/1995

(Continued)

*Primary Examiner*—Allan R. Wilson
(74) *Attorney, Agent, or Firm*—Charles A. Brill; Wade James Brady, III; Frederick J. Telecky, Jr.

(57) ABSTRACT

A low-cost ceramic package, in land-grid array or ball-grid array configuration, for micromechanical components is fabricated by coating the whole integrated circuits wafer with a protective material, selectively etching the coating for solder ball attachment, singulating the chips, flip-chip assembling a chip onto the opening of a ceramic substrate, under filling the gaps between the solder joints with a polymeric encapsulant, removing the protective material form the components, and attaching a lid to the substrate for sealing the package. It is an aspect of the present invention to be applicable to a variety of different semiconductor micromechanical devices, for instance actuators, motors, sensors, spatial light modulators, and deformable mirror devices. In all applications, the invention achieves technical advantages as well as significant cost reduction and yield increase.

8 Claims, 3 Drawing Sheets

| | FOREIGN PATENT DOCUMENTS | | WO | 98 27411 | 6/1988 |
|----|----|----|----|----|----|
| EP | 0 9772533 | 2/2000 | WO | 98 05935 | 2/1998 |
| EP | 1 127 838 | 8/2001 | | | |
| JP | 02 278872 | 4/1989 | * cited by examiner | | |

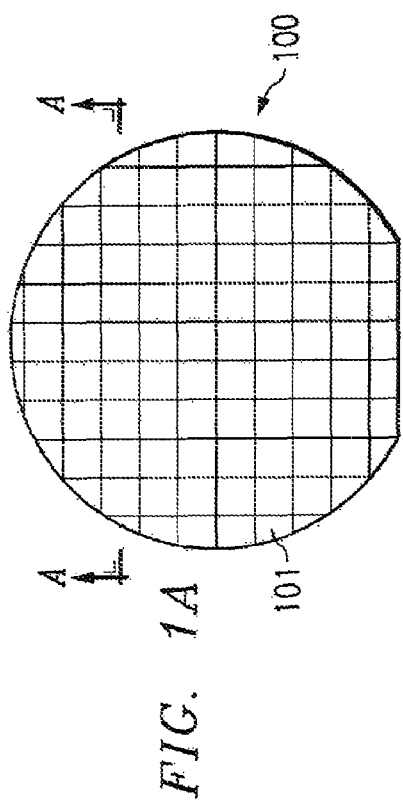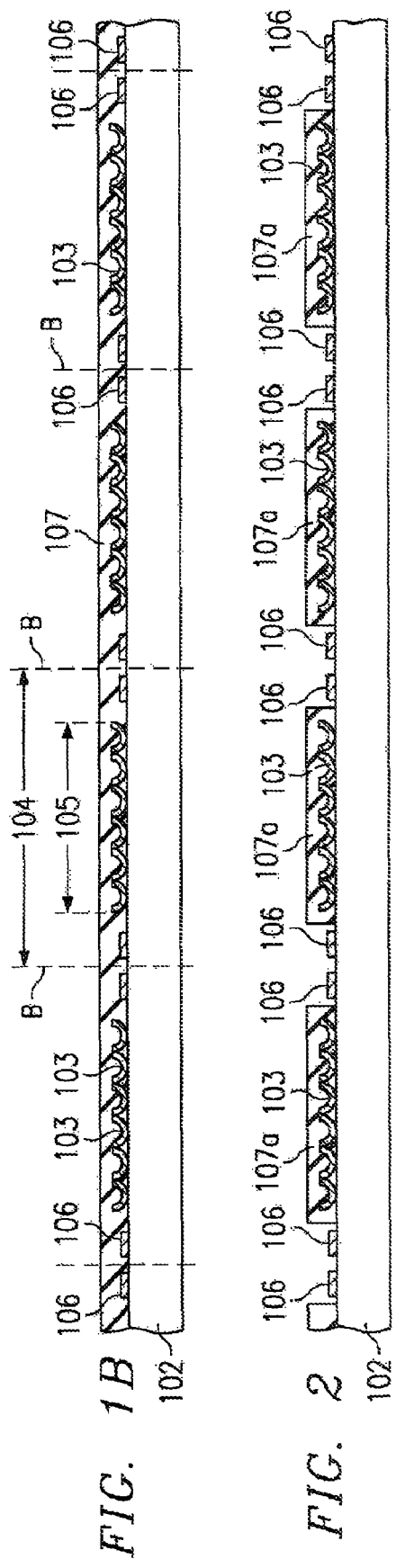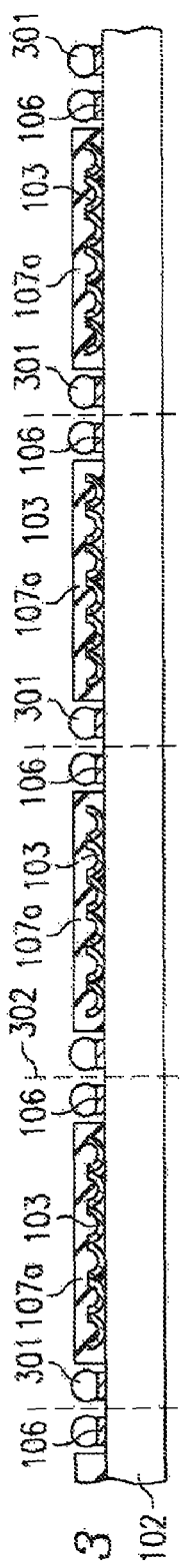

FLIP-CHIP ASSEMBLY OF PROTECTED MICROMECHANICAL DEVICES

CROSS-REFERENCE TO RELATED PATENTS

This is a continuation of U.S. application Ser. No. 10/695,026, filed Oct. 28, 2003, which is a continuation of U.S. application Ser. No. 10/283,494, filed Oct. 30, 2002, which is a divisional of 09/779,001, filed Feb. 8, 2001, which claims priority to U.S. Provision Application No. 60/184,091, filed Feb. 22, 2000, the entireties of which are incorporated herein by reference.

FIELD OF THE INVENTION

The present invention is related in general to the field of semiconductor devices and processes and more specifically to the design and fabrication of a land-grid array/ball-grid array package based on flip-chip assembly generally of micromechanical devices and specifically of digital mirror devices.

DESCRIPTION OF THE RELATED ART

Micromechanical devices include actuators, motors, sensors, spatial light modulators (SLM), digital micromirror devices or deformable mirror devices (DMD), and others. The technical potential of these devices is especially evident when the devices are integrated with semiconductor circuitry using the miniaturization capability of semiconductor technology.

SLMs are transducers that modulate incident light in a special pattern pursuant to an electrical or other input. The incident light may be modulated in phase, intensity, polarization or direction. SLMs of the deformable mirror class include micromechanical arrays of electronically addressable mirror elements or pixels, which are selectively movable or deformable. Each mirror element is movable in response to an electrical input to an integrated addressing circuit formed monolithically with the addressable mirror elements in a common substrate. Incident light is modulated in direction and/or phase by reflection from each element.

As set forth in greater detail in commonly assigned U.S. Pat. No. 5,061,049, issued on Oct. 29, 1991 (Hornbeck, "Spatial Light Modulator and Method"), deformable mirror SLMs are often referred to as DMDs in three general categories: elastometric, membrane, and beam. The latter category includes torsion beam DMDs, cantilever beam DMDs, and flexure beam DMDs. Each movable mirror element of all three types of beam DMD includes a relatively thick metal reflector supported in a normal, undeflected position by an integral, relatively thin metal beam. In the normal position, the reflector is spaced from a substrate-supported, underlying control electrode, which may have a voltage selectively impressed thereon by the addressing circuit.

When the control electrode carries an appropriate voltage, the reflector is electrostatically attracted thereto and moves or is deflected out of the normal position toward the control electrode and the substrate. Such movement or deflection of the reflector causes deformation of its supporting beam storing therein potential energy which tends to return the reflector to its normal position when the control electrode is de-energized. The deformation of a cantilever beam comprises bending about an axis normal to the beam's axis. The deformation of a torsion beam comprises deformation by twisting about an axis parallel to the beam's axis. The deformation of a flexure beam, which is a relatively long cantilever beam connected to the reflector by a relatively short torsion beam, comprises both types of deformation, permitting the reflector to move in piston-like fashion.

A typical DMD includes an array of numerous pixels, the reflectors of each of which are selectively positioned to reflect or not to reflect light to a desired site. In order to avoid an accidental engagement of a reflector and its control electrode, a landing electrode may be added for each reflector. It has been found, though, that a deflected reflector will sometimes stick or adhere to its landing electrode. It has been postulated that such sticking is caused by intermolecular attraction between the reflector and the landing electrode or by high surface energy substances adsorbed on the surface of the landing electrode and/or on the portion of the reflector which contacts the landing electrode. Substances which may impart such high surface energy to the reflector-landing electrode interface include water vapor or other ambient gases (e.g., carbon monoxide, carbon dioxide, oxygen, nitrogen) and gases and organic components resulting from or left behind following production of the DMD. A suitable DMD package is disclosed in commonly assigned U.S. Pat. No. 5,293,511 issued on Mar. 8, 1994 (Poradish et al., "Package for a Semiconductor Device").

Sticking of the reflector to the landing electrode has been overcome by applying selected numbers, durations, shapes and magnitudes of voltage pulses to the control electrode. Detail can be found in U.S. Pat. No. 5,096,279, issued on Mar. 17, 1992 (Hornbeck et al., "Spatial Light Modulator and Method"). Further improvement of the sticking problem is disclosed in commonly assigned U.S. Pat. No. 5,331,454, issued on Jul. 19, 1994 (Hornbeck, "Low Reset Voltage Process for DMD"). This patent describes a technique for passivating or lubricating the portion of the landing electrode engaged by the deformed reflector, and/or the portion of the deformed reflector which engages the landing electrode. Passivation is effected by lowering the surface energy of the landing electrode and/or the reflector, which is, in turn, effected by chemically vapor-depositing on the engageable surfaces a monolayer of a long-chain aliphatic halogenated polar compound, such as perfluoroalkyl acid. Objects do not easily, if at all, stick or adhere to low energy surfaces, which are also usually expected to be resistant to sorption thereonto of high surface-energy imparting substances such as water vapor.

Refinements of the passivation method are disclosed in U.S. Pat. Nos. 5,939,785, issued on Aug. 17, 1999 (Klonis et al., "Micromechanical Device including Time-release Passivant"), and 5,936,758, issued on Aug. 10, 1999 (Fisher et al., "Method of Passivating a Micromechanical Device within a Hermetic Package"). The method an enclosed source time-releasing a passivant, preferably a molecular sieve or binder impregnated with the passivant. Further, the method is placing a predetermined quantity of the passivant in the package just after device activation, and is then immediately welding a hermetic lid (free of passivant during the welding process) to the package.

The described sensitivity of most micromechanical devices would make it most desirable to protect them against dust, particles, gases, moisture and other environmental influences during all process steps involved in device assembly and packaging. It is, therefore, especially unfortunate that conventional assembly using gold wire bonding does not permit the removal of any protective material from the micromechanical devices after wire bonding completion, so that the devices have to stay unprotected through these process steps. As a consequence, yield loss is almost unavoidable.

Furthermore, today's overall package structure for micromechanical devices, based on multi-level metallization ceramic materials, and method of fabrication is expensive. This fact conflicts strongly with the market requirements for many applications of micromechanical devices, which put a premium at low device cost and, therefore, low package cost.

An urgent need has therefore arisen for a coherent, low-cost method of encapsulating micromechanical chips and for a low cost reliable package structure. The structure should be flexible enough to be applied for different micromechanical product families and a wide spectrum of design and process variations. Preferably, these innovations should be accomplished while shortening production cycle time and increasing throughput.

SUMMARY OF THE INVENTION

According to the present invention, a low-cost ceramic package, in land-grid array or ball-grid array configuration, for micromechanical components is fabricated by coating the whole integrated circuits wafer with a protective material, selectively etching the coating for solder ball attachment, singulating the chips, flip-chip assembling a chip onto the opening of a ceramic substrate, underfilling the gaps between the solder joints with a polymeric encapsulant, removing the protective material form the components, and attaching a lid to the substrate for sealing the package.

The package structure disclosed is flexible with regard to solder and underfill materials and geometrical detail such as storage space for chemical compounds within the enclosed cavity of the package.

It is an aspect of the present invention to be applicable to a variety of different semiconductor micromechanical devices, for instance actuators, motors, sensors, spatial light modulators, and deformable mirror devices. In all applications, the invention achieves technical advantages as well as significant cost reduction and yield increase.

In a key embodiment of the invention, the micromechanical components are micromirrors for a digital mirror device. In this case, the lid is a plate made of glass or any other material transparent to light, and the protective material is a photoresist as used in photolithographic processes.

It is another aspect of the present invention to keep the sensitive micromechanical components safely protected until the final attachment of the lid, resulting in significantly higher assembly and process yield and enhanced device quality and reliability.

Another aspect of the invention is to use well-controlled solder ball attachment and solder joint underfill processes, providing a package with low mechanical stress and necessary control for providing planarity requirements.

Another aspect of the invention is to be applicable to single-level metal ceramic substrates, which can be manufactured at low cost.

Another aspect of the invention is to provide assembly and packaging designs and processes with flexibility to produce land-grid array or ball-grid array packages.

These aspects have been achieved by the teachings of the invention concerning structure and methods suitable for mass production.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1A is a schematic top view of a semiconductor wafer having a plurality of integrated circuits with micromechanical components.

FIGS. 1B to 10 illustrate the flip-chip assembly process steps according to the invention for fabricating a land-grid array package and a ball-grid array package for a chip having micromechanical components.

FIG. 1B is a schematic cross section of a portion of the semiconductor wafer in

FIG. 1A. The cross sectional view illustrates a plurality of micromechanical components coated by a protective material according to the invention.

FIG. 2 is a schematic cross section of the portion of the semiconductor wafer shown in FIG. 1B after selective etching of the protective coating.

FIG. 3 is a schematic cross section of the portion of the semiconductor wafer shown in FIG. 2 after depositing the solder balls.

FIG. 4 is a schematic cross section of a discrete chip having micromechanical components and solder balls, after separation from the composite wafer shown in FIG. 3.

FIG. 5 is a schematic top view of the insulating substrate, its central opening and two pluralities of metallic contact pads.

FIG. 6 is a schematic cross section of the substrate shown in FIG. 5 after mounting the chip shown in FIG. 4 according to the invention.

FIG. 7 is a schematic cross section of the mounted chip shown in FIG. 6 after filling the gap spacing the chip and the substrate with a polymeric encapsulant according to the invention.

FIG. 8 is a schematic cross section of the assembled chip shown in FIG. 7 after removing the protective material from the micromechanical components.

FIG. 9 is a schematic cross section of the assembled chip shown in FIG. 8 after attaching the lid, completing the land-grid array package according to the invention.

FIG. 10 is a schematic cross section of the completed device of FIG. 9 after attaching a plurality of solder balls to the substrate and creating a ball-grid array package.

DETAILED DESCRIPTION OF THE PREFERRED EMBODIMENTS

Figure 4:
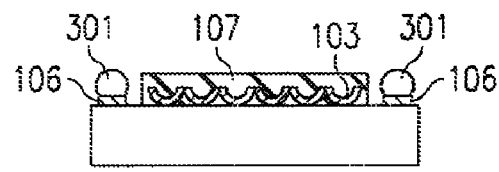

FIG. 1A schematically shows a semiconductor (usually silicon) wafer, generally designated 100, with a plurality of devices 101 not yet singulated from the wafer. A cross section along line A-A is partially reproduced in FIG. 1B in schematic and simplified manner.

As FIG. 1B indicates, the semiconductor (silicon) basic material 102 supports a number of devices of length 104. Each device consists of an integrated circuit (not shown in FIG. 1B) and a plurality of micromechanical components 103. The plurality of components 103 occupies a length 105 located in the central portion of the total device length 104. Furthermore, the plurality of components 103 is configured in a plane. In the peripheral portions of each device, there is a plurality of metallic terminals 106, which serve as electrical inputs/outputs of the integrated circuit and the micromechanical components. Terminals 106 are typically metallic; commonly used metals in the semiconductor industry are aluminum, copper, and gold. Often, refractory metals such as chromium, molybdenum, titanium, or titanium-tungsten alloy are used over nickel, copper, or gold; they may have a surface layer of solder-compatible metal such as palladium or platinum.

The dashed lines designated "B" in FIG. 1B indicate the locations where the rotating saws will eventually separate each device from the wafer in a singulation step before assembly.

The micromechanical components 103 may include actuators, motors, sensors, spatial light modulators, and deformable mirror devices. By way of example and purposes of illustration, micromechanical components 103 are digital micromirror devices (DMD), as manufactured by Texas Instruments Incorporated, Dallas, Tex., U.S.A.

The semiconductor basic material is usually silicon in single-crystalline form. The material may also be silicon-germanium, gallium arsenide, or any other semiconductor material used for device production.

The fabrication process flow steps of the preferred embodiment are illustrated in FIGS. 1B through 9 and 10.

Process Step 1: Coating Wafer Surface.

For the full benefit of the present invention, it is pivotally important that the surface of the whole wafer including the plurality of micromechanical components 103 is coated with a protective material 107; see FIG. 1B. By way of example, material 107 may be a layer of photoresist material as used in semiconductor photolithographic processes. This layer is able to withstand the elevated temperatures employed later in solder reflow and underfill curing. The protective layer prevents any deposition of dust or environmental particles on the micromechanical devices and protects the devices against process-related damages (such as scratches), until all process steps are completed. Consequently, the protective layer contributes significantly to process yield and device quality improvement.

Process Step 2: Selectively Etching.

As shown in FIG. 2, the protective layer 107 is etched selectively in order to expose the terminals 106 of each device. The portions 107a of the protective coating, however, must remain over the plurality of micromechanical components 103 of each device.

Process Step 3: Depositing Solder Balls.

In the next process step, illustrated in FIG. 3, solder balls 301 are deposited onto the exposed terminals 106 so that one solder ball is deposited onto each terminal.

As used herein, the term solder "ball" does not imply that the solder contacts are necessarily spherical; they may have various forms, such as semispherical, half-dome, truncated cone, or generally bump, or a cylinder with straight, concave or convex outlines. The exact shape is a function of the deposition technique (such as evaporation, plating, or prefabricated units) and reflow technique (such as infrared or radiant heat), and the material composition. Generally, a mixture of lead and tin is used; other materials include indium, alloys of tin/indium, tin silver, tin/bismuth, or conductive adhesive compounds. The melting temperature of the solder balls 310 may be different (usually higher) from the melting temperature of the solder balls used for connecting the device to the outside world.

Several methods are available to achieve consistency of geometrical shape by controlling amount of material and uniformity of reflow temperature. Typically, the diameter of the solder balls ranges from 0.1 to 0.5 mm, but can be significantly larger. Commercial suppliers for pre-fabricated solder balls are, for example, Indium Metals, Utica, N.Y., U.S.A.; Alpha Metals, Jersey City, N.J., U.S.A.

More technical detail about depositing solder balls on a whole wafer, without ball duplication or missing a ball, can be found, for instance, in U.S. patent application Ser. Nos. 09/186,973, filed Nov. 5, 1998 (Heinen et al., "Wafer-Scale Assembly of Chip-Size Packages"), and No. 60/066,268, filed Nov. 20, 1997 (Amador et al., "Wafer-scale Assembly of Chip-Size Packages"), to which the present invention is related.

Process Step 4: Separating Composite Structure.

Lines 302 in FIG. 3 extend through surface portions freed from the protective coating; however, they indicate the same positions as lines "B" in FIG. 1B. The rotating saws, moving along the saw (or "scribe") streets of the semiconductor wafer, separate each chip along line 302 from the original wafer.

One such singulated chip is depicted schematically in the cross section of FIG. 4.

The plurality of micromechanical components 103, protected by coating 107, is configured in a plane in the center portion of the chip. The plurality of terminals 106, with solder balls 301 attached, is configured in peripheral portions of the chip. The chip with the micromechanical devices is thus readied for assembly onto a substrate using the so-called "flip-chip" technology.

Process Step 5: Providing Substrate.

Figure 5:
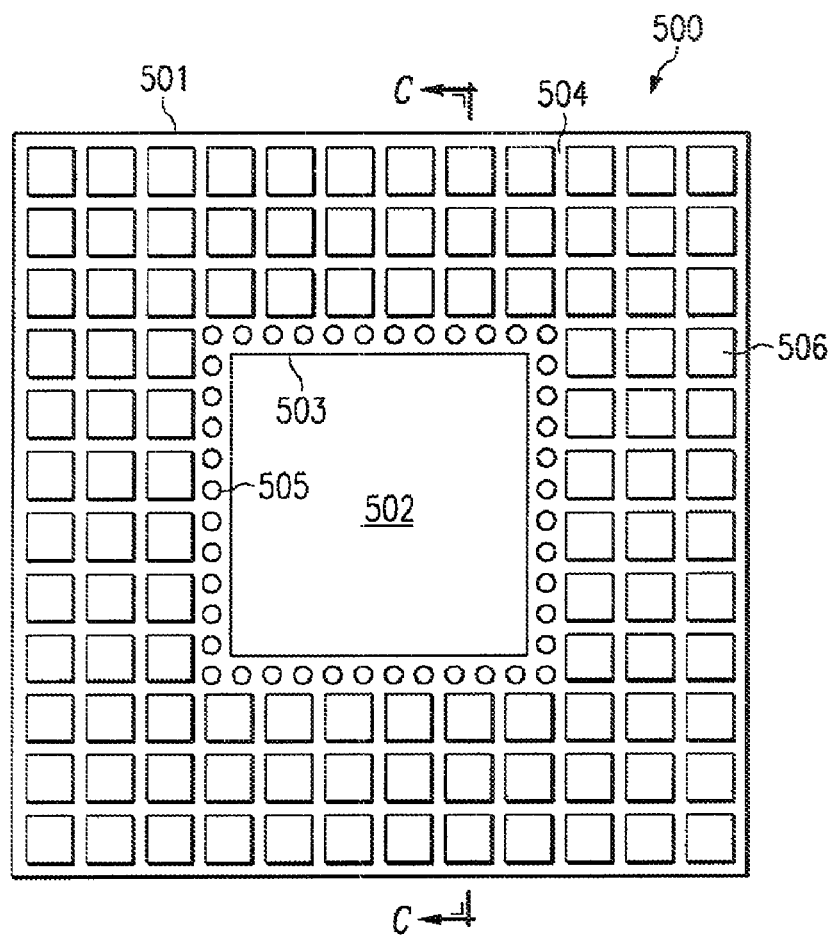

The preferred embodiment of the present invention uses a low-cost electrically insulating substrate made of ceramic having first and second surfaces, a central opening, and single-level metallization. As an example, FIG. 5 shows the schematic top view of a substrate, generally designated 500, with square outline 501 and a central opening 502 with square-shaped outline 503. The view of FIG. 5 is on the first surface 504 of the substrate.

First surface 504 exhibits the single-level metallization of the substrate. This metallization provides a first plurality of contact pads 505 in proximity of the outline 503 of the opening. By way of example, these contact pads 505 are shown in FIG. 5 having circular shape. They may, however, have square shape or any other shape. The contact pads are connected to a network of routing lines, integral with the substrate and also portion of the single-level metallization, yet not shown in FIG. 5.

Further, first surface 504 has a second plurality of contact pads 506 remote from opening 502. In FIG. 5, the pads 506 are shown in square shape arranged in arrays of contact lands positioned along the outline 501 of the substrate 500. Different geometrical shapes and arrangements are acceptable. Contact pads 506 are also electrically connected to the routing lines (not shown in FIG. 5). Commonly used metals for both contact pads 505 and 506 include nickel, copper, and gold. They may have a surface layer of solder-compatible metal such as palladium or platinum.

Figure 6:
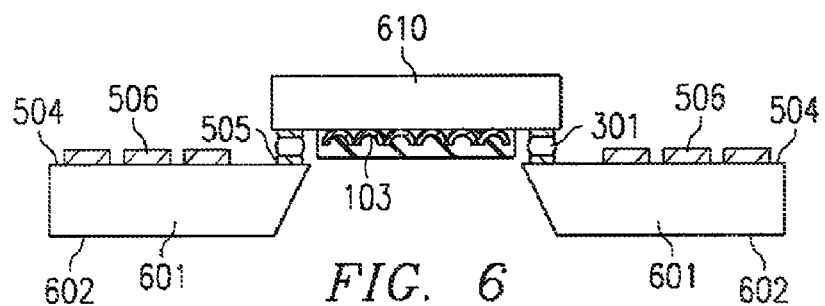

FIG. 6 illustrates a cross sectional view of substrate 500 along lines C-C in FIG. 5. The cross section through the ceramic material is designated 601. In addition to first substrate surface 504, FIG. 6 shows the second surface 602. First surface 504 and second surface 602 are substantially parallel to each other. Further shown in FIG. 6 are cross sections through the first plurality of contact pads 505 and the second plurality of contact pads 506.

Process Step 6: Aligning Chip and Substrate.

An individual chip with solder balls 301, as shown in FIG. 4, is flipped and aligned with the first plurality of contact pads 505 of substrate 500. Since the configuration of solder balls 301 mirror images the configuration of contact pads 505, each solder ball 301 can be placed into vertical alignment with its respective contact pad 505. Two cameras supply the vision system for alignment so that the alignment can be performed automatically; however, a microscope for visual inspection may be substituted. Alignment may be accomplished, for example, by rotating and translating the chip. Flip-chip alignment to substrates is performed routinely in industry. More detail of alignment techniques can be found, for instance, in the U.S. patent applications cited above.

Process Step 7: Forming Solder Joints.

As illustrated in FIG. 6, chip 610 having solder balls 301 is brought into contact with the substrate 601 having contact pads 505 so that the solder balls 301 impact their respective contact pads 505 on the substrate. Next, thermal energy is applied to chip and substrate, preferably rapidly regulated radiant heat. The heating step may be performed, for example, in an inert gas environment, such as dry nitrogen or filtered gases, to provide for additional process control and to prevent excess particulates from settling on the chip surface. Non-contact or contact style thermocouples with closed-loop feedback to the heating source may monitor the temperature on both the chip and the substrate.

For some micromechanical devices such as micromirrors, it may be important to perform the solder reflow process step using control features as described in the above-cited U.S. patent application Ser. Nos. 09/186,973 and No. 60/066,268. One important feature is to perform the alignment and heating steps in a single apparatus and in a single operation without moving and without the risk of losing the alignment, as could easily occur in a conventional chain furnace heating operation. The heating step follows and is combined with the alignment step, and does not just represents the heating of pre-assembled parts. In addition, the use of radiant energy sources, as opposed to furnaces, allows rapid temperature ramping or profiling, and also more uniform and more easily controllable heating and cooling cycles. Radiant heating allows a smooth transition from ambient temperature to the desired hot temperature, and rapid thermal response. The radiant energy is preferably provided by an optical heat source emitting near infrared light, such as incandescent lamps (halogen lamps with tungsten filament and xenon filling).

Furthermore, by using selected reflective surfaces on non-active areas exposed to the near-infrared light, the assembly of chip and substrate can be heated while the remainder of the surfaces stay at a much lower temperature. Consequently, the assembly rapidly heats up to a temperature at which solder balls 301 begin to melt or reflow. This temperature is typically about 183° C. During the reflow, the solder will form a metallurgical bond (so-called "solder joint") with the top metal of the contact pads 505.

Another control feature, especially important for micromechanical devices such as micromirrors, concerns the uniformity of the height of the molten solder balls. It is advantageous to employ controls similar to the mechanisms described in the above-cited U.S. Patent Application No. 60/066,268. In this apparatus, three ultra-precision, independent Z axes are arranged 120° apart and together control the Z height, Pitch and Roll of the substrate. The first step is to move the substrate towards the solid solder balls using all three axes, until the substrate makes contact with the balls. The coplanarity (pitch and roll) of the wafer to the balls is obtained by allowing each of the Z motors to independently "bottom out" against the plane of the solder balls. The "touchdown" of the wafer on the balls can be detected by the Z motor controller as a sudden change in the speed of descent of the axis. Next, the pre-determined temperature profile is carried out. During the profile, at the time by which all the solder balls should be molten, the Z axis position is reduced to a height which is equal to the ball diameter minus the known variation of the ball diameters. This action guarantees that even the smallest diameter ball is in contact with the wafer. The diameter of the smallest ball is contained in the statistical variation and the ball diameter consistency as supplied by the vendor of the balls. Once it has been established that all balls are in contact with the wafer and sufficient time has passed so that all balls should be molten, the Z height is raised to the level at which the solder balls are desired to be solidified, the final ball stand-off height. At this height the temperature is reduced to below the solder reflow temperature and the solder balls all solidify. The height of all the solder balls will now be equal, independent of the shape and volume of the balls. The preferred height of the solidified solder bumps is between 25 and 150 μm, often approximately 100 μm.

As a consequence of the uniform height of the solder joints, the substrate 601 in FIG. 6 is positioned in a plane parallel to the plane of the micromechanical components 103. Specifically, the second surface 602 of substrate 601 is in a plane parallel to the components plane.

As a further consequence of the uniform height of the solder balls, a gap is spacing apart chip 610 and substrate 601. The height of the gap is equal to the height of the solder balls, and the width of the gap is equal to the distance between the solder balls.

Process Step 8: Filling Gap.

Figure 7:
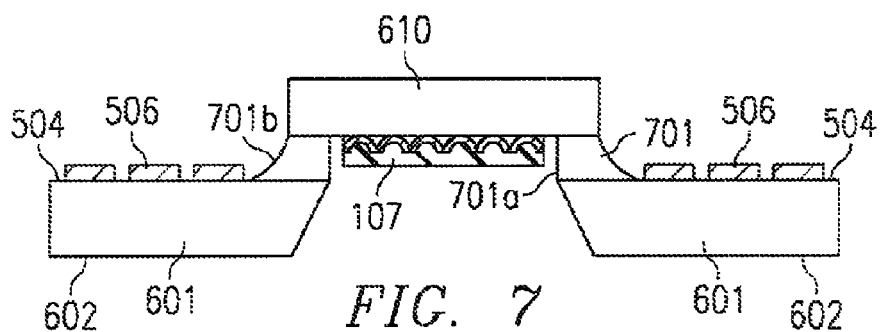
Figure 8:
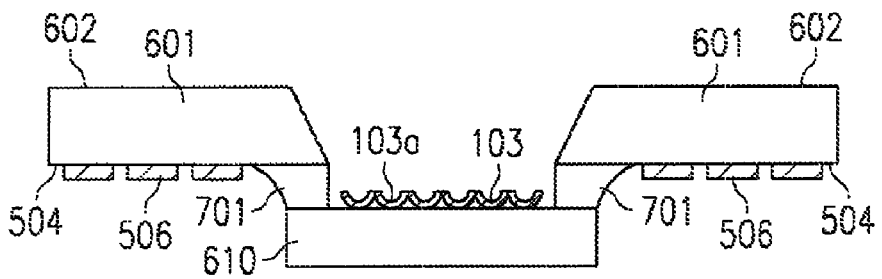

In order to form a continuous frame of material around the perimeter of opening 502 of the substrate the gap spacing apart chip 610 and substrate 601 has to be filled. As indicated in FIG. 7, the filling is accomplished by a polymeric encapsulant 701, commonly referred to as the "underfill" material. In the preferred process, care is taken to produce not only a continuous frame of material, but concurrently to reduce the mechanical stress at the solder joints. As an example, a process may be used as described in U.S. patent application Nos. 60/084,440, filed May 6, 1998 (Thomas, "Low Stress Method and Apparatus of Underfilling Flip-Chip Electronic Devices") and No. 60/084,472, filed May 6, 1998 (Amador et al., "Low Stress Method and Apparatus of Underfilling Flip-Chip Electronic Devices"), to which the present invention is related.

In the preferred process, the melting temperature of 183° C. for the eutectic lead/tin mixture is overshot to about 220° C. (for about 60 to 120 s within the 20 min of the solder reflow period). For alternative solder selections, times and temperatures are suitably modified. During reflow, the stress in the solder joint is at level zero. During the following cooling, the solder solidifies, but the assembly is kept at an elevated temperature between 80 and 140° C., preferably between 90 and 100° C. In this time period, the stress increases slightly from its zero level to a non-critical value, well below any level which could pose a risk to structurally weak dielectric layers of the chip or to the solder joints.

It is pivotal that the assembly not be allowed to continue the cooling process down to ambient temperature, but is maintained at a constant elevated temperature throughout the underfill period, which may last up to 20 min. In the underfill process, the polymeric precursor is dispensed onto the first surface 504 of substrate 601 adjacent to the perimeter of chip 610. The force of surface tension pulls the viscous polymer into the spaces between the solidified solder bumps surrounding opening 502 and forms the meniscus 701a towards the opening and the meniscus 701b towards the array of contact pads 506 (see FIG. 7).

Suitable polymeric precursors are formed of a material curable by thermal or radiation energy, and are preferably composed of an anhydride-hardened prepolymer such as an epoxy resin. They usually contain a catalyst such as an amine compound, and fillers such as silica or alumina. Polymeric precursors are commercially available; one example is by the Dexter Hysol Corporation, U.S.A., under brand name FP 4527.

After completing the underfill process, the assembly proceeds directly from the elevated temperature mentioned above to the increased temperature needed for polymerizing ("curing") the underfill precursor. During this to time span (about 60 to 120 min), the stress falls to very low levels. After the encapsulant his fully cured, the temperature is allowed to drop to ambient temperature in the cool down period, while the stress increases only slightly, well below any risk for damage to structurally weak dielectric films or solder joints. As intended, the stress throughout the assembly is approximately uniformly distributed and for the most past absorbed by the encapsulant.

Process Step 9: Removing Protective Material.

As indicated in FIG. 7, the protective material 107 still remains over the surface of the micromechanical components during the underfilling process. After ambient temperature is reached, this protective material can be safely removed (see FIG. 8) so that the surfaces 103a of the components 103 are exposed. When the protective material consists of photoresist as commonly used in semiconductor technology, the step of removing comprises dissolving the photoresist layer in standard practice.

In the case of micromirror components, this process step also consists of removing the photoresist under the micromirrors and activating the components using plasma etch or a combination of a plasma etch/UV cure process to remove any residual contaminants from the mirror surfaces.

Process Step 10: Inserting Passivant.

For some micromechanical devices such as micromirrors, it is advantageous to have ridge-like protrusions formed in the ceramic substrate near the components (not shown in FIGS. 6 to 10). These protrusions serve the purpose of storing chemical compounds intended to remain inside the package volume after closure by the covering lid. These chemicals are typically supplied as pills or granular material and are suitable for releasing passivants continuously for the lifetime of the device in order to coat all contacting surfaces of the micromechanical devices. More detail about composition, operation and method of metered deposition can be found in the above-quoted U.S. Pat. Nos. 5,939,785 and 5,936,758.

Process Step 11: Attaching Lid.

Figure 9:
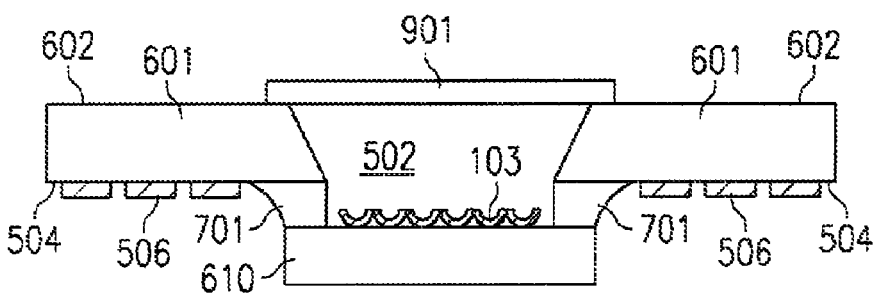
Figure 10:
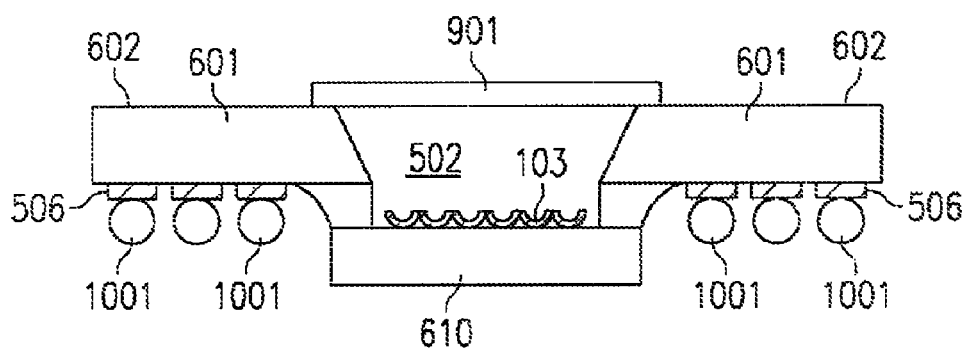

Right after the deposition of any chemical compound, a lid 901 is attached to close the package, as shown in FIG. 9. Typically, lid 901 has to be cleaned from impurities and dehydrated by baking in reduced-pressure environment before attachment. Afterwards, it is attached to the second surface 602 of the substrate 601, preferably using an epoxy adhesive. Temperature and time needed to polymerize the adhesive also serve to sublimate an amount of the passivant within the package so that the active surfaces of the micromechanical components are coated with at least a monolayer of the passivant.

For micromirror devices, lid 901 is a plate made of glass or any other material transparent to light in the visible range of the electromagnetic spectrum. Requirements for optical flatness of the plate are described in quoted U.S. Pat. No. 5,939,785. Care has to be taken that attached lid 901 is in a plane parallel to the plane of the plurality of micromirrors 103.

By attaching lid 901, the second level of opening 502 is closed. The first level of the opening is closed by solder attaching chip 610; all sides of the opening are closed by the frames of the solder bumps and the underfill material. The micromechanical components are thus in a fully enclosed package.

Process Step 12: Marking.

The enclosed micromechanical devices are marked with identification such as device type and number, fabrication information, country of origin, etc.

Process Step 13: Attaching Solder Balls

The package as depicted in FIG. 9 is a so-called "land-grid array" package with contact pads 506 designed for pressure contacts serving many customer needs. If a so-called "ball-grid array" package is desired, solder "balls" 1001 may be attached to the substrate terminals 506 in FIG. 10. The solder balls may be a conventional lead/tin alloy, or a lead-free mixture as described above. The diameter can vary widely; typical sizes range from 0.5 to 1.5 mm.

After electrical testing the land grid array/ball grid array device, the finished micromechanical device is ready for packing and shipping.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the thickness of substrate and lid, as well as the height consumed for flip-chip assembly can be minimized in order to reduce the overall thickness of the device as needed for specific applications. As another example, the invention can be extended to batch processing, further reducing packaging costs. As another example, the location of the substrate contacts to the "outside world" can be changed from the chip attachment surface to the lid attachment surface of the substrate. It is therefore intended that the appended claims encompass any such modifications or embodiments.

What is claimed is:

1. A semiconductor wafer comprising:
 a plurality of devices formed on a common surface of the semiconductor wafer, each device including an integrated circuit and a plurality of micromechanical components, and
 a plurality of terminals disposed about the periphery of said devices, serving as electrical inputs/outputs of said integrated circuit and said micromechanical components; and
 a protective material coating said micromechanical components, but not coating said periphery of said device where said terminals are located.

2. The semiconductor wafer of claim 1 further comprising solder electrically connected to said plurality of terminals.

3. The semiconductor wafer of claim 2 wherein said solder comprises solder balls respectively located on said terminals.

4. The semiconductor wafer according to claim 1 wherein each said device is a digital micromirror device.

5. The semiconductor wafer according to claim 1 wherein said micromechanical components are micromirrors.

6. The semiconductor wafer according to claim 2 wherein said solder is selected from a group consisting of lead/tin, indium, tin/indium, tin/silver, tin/bismuth, solder paste, and solder-coated spheres.

7. The semiconductor wafer according to claim 1, wherein said protective material is a photoresist.

8. The semiconductor wafer according to claim 1, wherein said protective material is fills gaps between components in the device.

* * * * *